(12) United States Patent
Mao et al.

(10) Patent No.: US 11,477,918 B2
(45) Date of Patent: Oct. 18, 2022

(54) HEAT EXCHANGE SYSTEM

(71) Applicant: Fulian Precision Electronics (Tianjin) Co., LTD., Tianjin (CN)

(72) Inventors: Tze-Chern Mao, New Taipei (TW); Yen-Chun Fu, New Taipei (TW); Chih-Hung Chang, New Taipei (TW); Chao-Ke Wei, New Taipei (TW); Li-Wen Chang, New Taipei (TW); Ching-Tang Liu, New Taipei (TW); Hung-Chou Chan, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 21 days.

(21) Appl. No.: 17/361,678

(22) Filed: Jun. 29, 2021

(65) Prior Publication Data

US 2021/0329817 A1    Oct. 21, 2021

Related U.S. Application Data

(62) Division of application No. 15/678,029, filed on Aug. 15, 2017, now Pat. No. 11,083,109.

(30) Foreign Application Priority Data

Jun. 21, 2017    (CN) .......................... 201710477148.8

(51) Int. Cl.
*H05K 7/20*      (2006.01)
*F28D 21/00*      (2006.01)
(Continued)

(52) U.S. Cl.
CPC .......... *H05K 7/20745* (2013.01); *F01K 7/16* (2013.01); *F17C 9/04* (2013.01); *F24F 5/00* (2013.01);
(Continued)

(58) Field of Classification Search
CPC ......... H05K 7/20745; F01K 7/16; F17C 9/04; F24F 5/00; F24F 5/0035;
(Continued)

(56) References Cited

U.S. PATENT DOCUMENTS

2010/0205979 A1*   8/2010   Gentry ...................... F17C 9/04
                                                         62/50.3
2013/0160486 A1*   6/2013   Amir ...................... F01K 25/10
                                                         62/611

(Continued)

FOREIGN PATENT DOCUMENTS

CN        104197576 A     12/2014
JP         H03-003902 A    1/1991

*Primary Examiner* — Mickey H France
(74) *Attorney, Agent, or Firm* — ScienBiziP, P.C.

(57) ABSTRACT

A heat exchange system includes a heat-absorbing substance such as Liquid Natural Gas (LNG), a heat dissipation apparatus, a water storage tank, a heat exchanger, and a heat exchanger. The heat exchanger is coupled between the LNG and the water storage tank. The heat exchanger is coupled between the heat dissipation apparatus and the water storage tank. The heat exchanger transfers heat of the heat dissipation apparatus to water of the water storage tank to lose heat to the heat exchanger, and the heat exchanger transfers heat of the water to the LNG.

17 Claims, 10 Drawing Sheets

(51) Int. Cl.
  *F01K 7/16* (2006.01)
  *F28D 20/00* (2006.01)
  *F24F 5/00* (2006.01)
  *F17C 9/04* (2006.01)
  *F28D 15/00* (2006.01)
  *F24F 13/30* (2006.01)

(52) U.S. Cl.
  CPC .......... *F24F 5/0017* (2013.01); *F24F 5/0035* (2013.01); *F24F 13/30* (2013.01); *F28D 15/00* (2013.01); *F28D 20/0034* (2013.01); *F28D 21/001* (2013.01); *F24F 2005/0025* (2013.01); *F28D 21/0001* (2013.01); *Y02B 30/54* (2013.01); *Y02E 60/14* (2013.01)

(58) Field of Classification Search
  CPC .............. F24F 2005/0025; F28D 15/00; F28D 20/0034; F28D 21/001; F28D 21/0001
  See application file for complete search history.

(56) References Cited

U.S. PATENT DOCUMENTS

2013/0291567 A1\* 11/2013 Bohra ................ F17C 5/06
                                                    62/48.1
2016/0281932 A1   9/2016 Karlsson
2017/0038008 A1\* 2/2017 Tada .................. F17C 9/04

\* cited by examiner

HEAT EXCHANGE SYSTEM

FIELD

The subject matter herein generally relates to equipment cooling and a heat exchange system for the purpose.

BACKGROUND

To change to a gaseous state, Liquefied Natural Gas (LNG) needs to absorb heat. In another aspect, an apparatus, such as data center, generates a lot of heat that needs to be dissipated.

BRIEF DESCRIPTION OF THE DRAWINGS

Implementations of the present disclosure will now be described, by way of example only, with reference to the attached figures.

DETAILED DESCRIPTION

Figure 1:
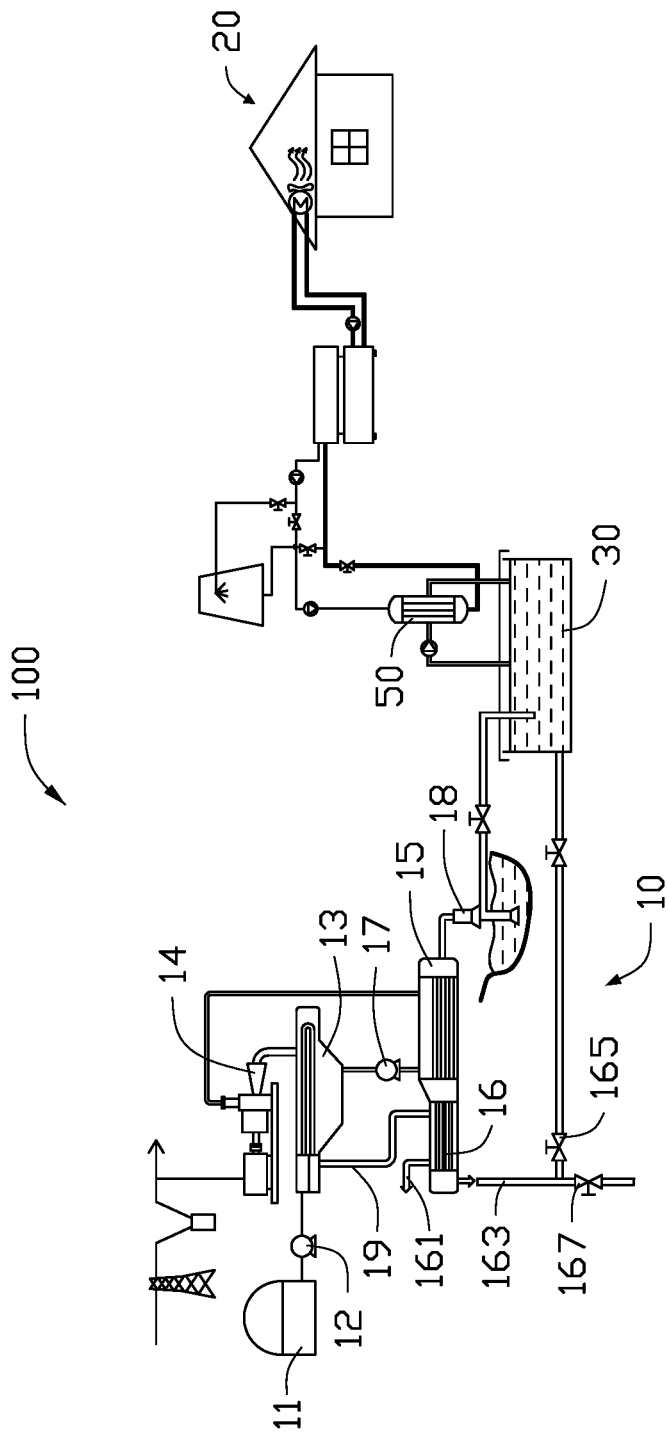
FIG. 1 is a schematic diagram of an exemplary embodiment of a heat exchange system.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected.

The term "comprising" means "including, but not necessarily limited to"; it specifically indicates open-ended inclusion or membership in a so-described combination, group, series, and the like.

FIG. 1 illustrates a heat exchange system 100 using a container of liquefied natural gas (LNG) (not shown) to take heat from a data center (not shown). The heat exchange system 100 includes heat exchanger components 10, a heat producer 20, and a water storage tank 30. The heat exchanger components 10 allows LNG that is stored in an LNG tank 11 to be heated. The heat producer 20 is a heat-producing apparatus, such as a data center, a workshop, or an office building.

In at least one exemplary embodiment, the heat exchanger components 10 includes a first pump 12, a heat exchanger 13, a turbine 14, a heat exchanger 15, a heat exchanger 16, a second pump 17, a third pump 18 (not shown), and a pipe 19. The first pump 12 is coupled between the LNG tank 11 and the heat exchanger 13. The pipe 19 is coupled between the heat exchanger 13 and the heat exchanger 16 to transfer LNG to the heat exchanger 16 from the exchanger 13.

Figure 2:
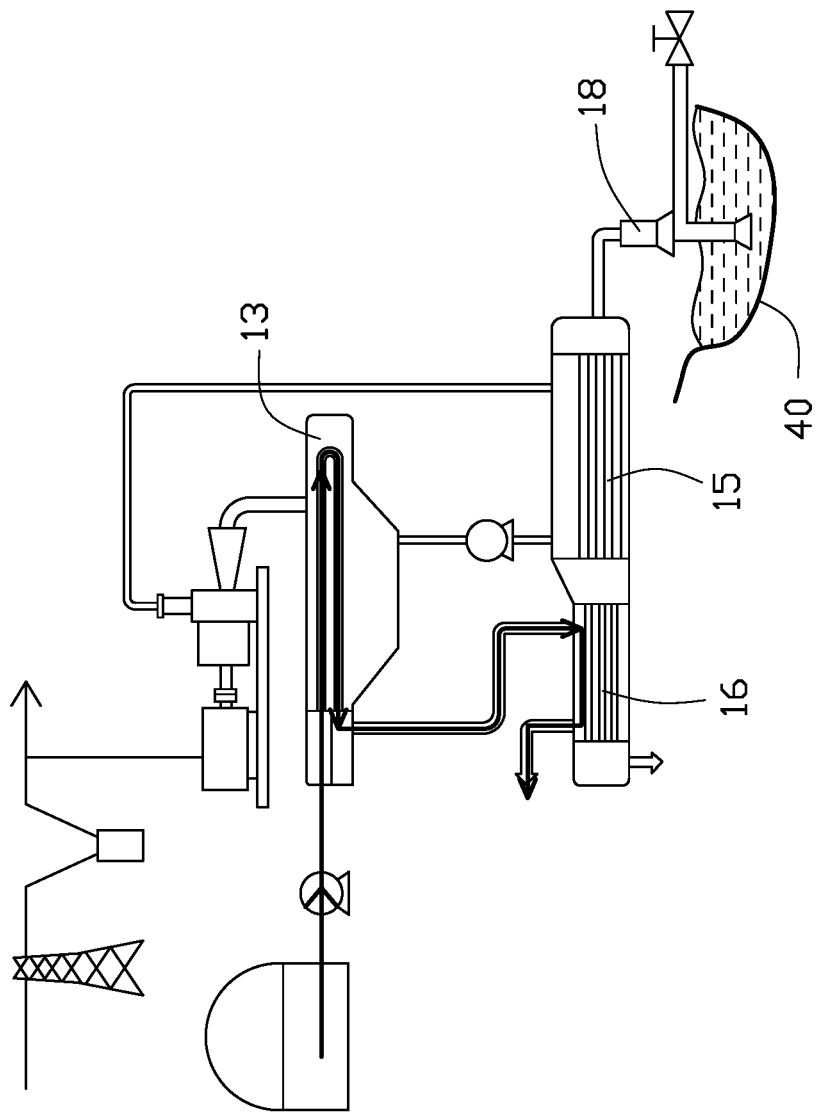
FIG. 2 is a diagram of a heat exchanger of the heat exchange system of FIG. 1.

In at least one exemplary embodiment, the third pump 18 is coupled between water storage tank 30 and the heat exchanger 15. The third pump 18 is configured to pump water from the water storage tank 30 into the heat exchanger 15. Further, the third pump 18 can pump water from a pool 40 into the heat exchanger 15 when the water in the water storage tank 30 is not needed, as shown in FIG. 2. The exchanger 15 is coupled to the heat exchanger 16 and transfers water to the heat exchanger 16.

An intermediate heating medium fills the heat exchanger 15. The intermediate heating medium is separated from water pumped by the third pump 18. The intermediate heating medium absorbs heat from the water in the heat exchanger 15.

A loop is formed by the heat exchanger 15, the second pump 17, the heat exchanger 13, and the turbine 14, the intermediate heating medium flows therein. The intermediate heating medium flows through the first heat exchanger 13 to be made liquid, the second pump 17 drives the intermediate heating medium to flow from the first heat exchanger 13 into the heat exchanger 15, and then flow through the turbine 14 to rotate the turbine 14 to generate electrical power. The generated electrical power is provided to an electric power system (not labeled). After passing through the turbine 14, the intermediate heating medium flows back to the heat exchanger 13. In the heat exchanger 13, the intermediate heating medium and the LNG are isolated, but heat of the intermediate heating medium is transferred to the LNG.

The exchanger 16 includes a gas outlet 161 and a water outlet 163. In the third exchanger 16, LNG flows from the heat exchanger 13 and water flows from the heat exchanger 15, and heat of the water is transferred to the LNG to gasify the LNG.

The gasified LNG is outputted from the gas outlet 161. Water flows out of the exchanger 16 through the water outlet 163. Water can flow back to the water storage tank 30 through a first valve 165, or be discharged through a second valve 167.

FIG. 2 illustrates the LNG flowing in the heat exchanger components 10. The LNG flows through the first heat exchanger 13 and the heat exchanger 16 to be made into a gas. When LNG is located in the first heat exchanger 13, heat is transferred from the water to the intermediate heating medium, and the heat is transferred from intermediate heating medium to the LNG.

Figure 3:
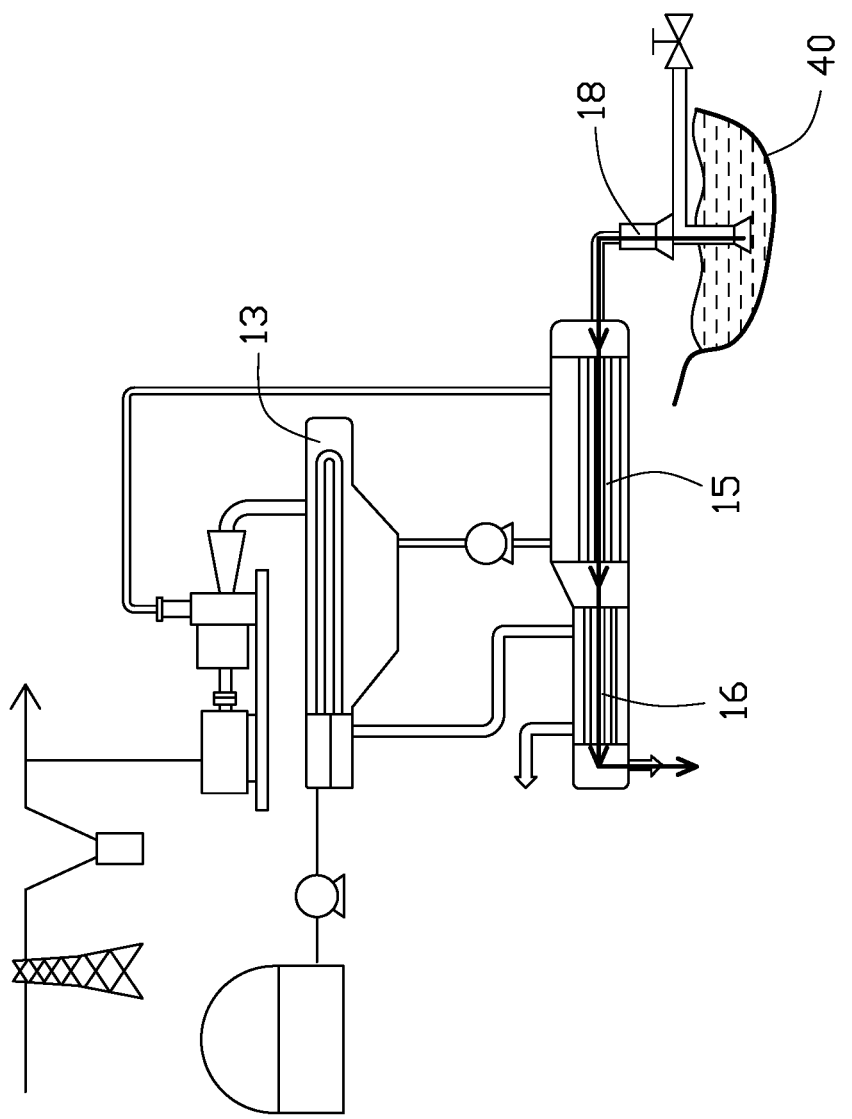
FIG. 3 is another diagram of the heat exchanger of the heat exchange system of FIG. 1.

FIG. 3 illustrates the water flowing in the heat exchanger components 10. Water pumped from the water storage tank 30 or the pool 40 flows through the heat exchanger 15 and the heat exchanger 16. In the heat exchanger 15, heat is transferred from the water to the intermediate heating medium, and the heat is transferred from intermediate heating medium to the LNG.

Figure 4:
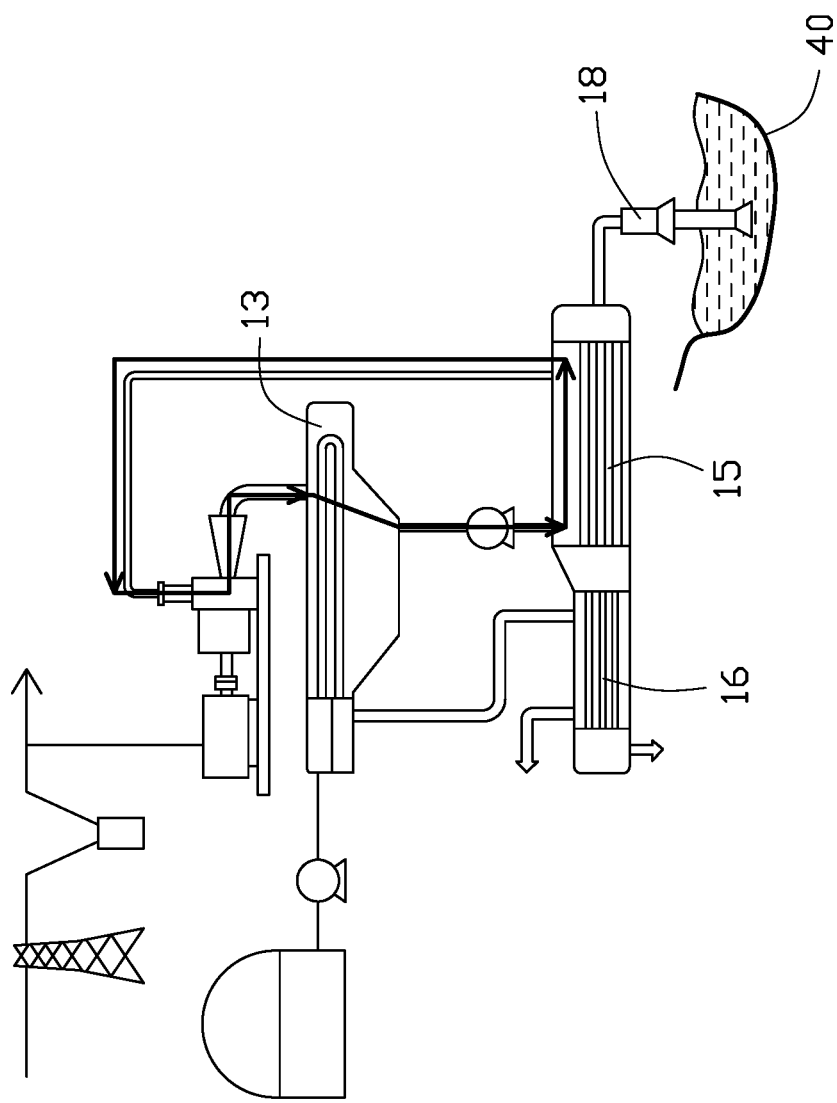
FIG. 4 is another diagram of the heat exchanger of the heat exchange system of FIG. 1.

FIG. 4 illustrates the intermediate heating medium flowing in the loop. The intermediate heating medium flows from the heat exchanger 13 to the heat exchanger 15 and back to the heat exchanger 13. In the heat exchanger 15, heat of the water is transferred to the intermediate heating medium. When the intermediate heating medium is in the first heat exchanger 13, heat of the intermediate heating medium is transferred to the LNG.

Figure 5:
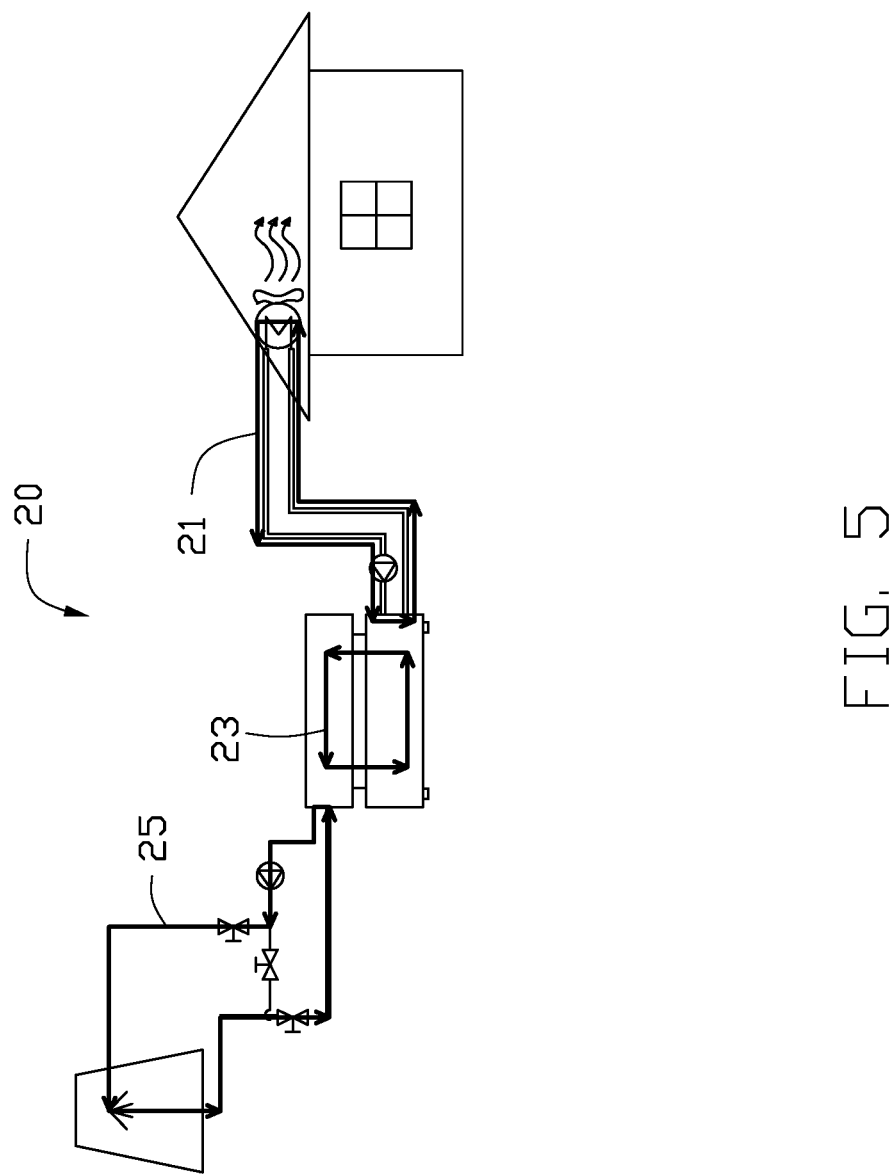
FIG. 5 is a diagram of another heat exchanger of the heat exchange system of FIG. 1.

FIG. 5 illustrates that the heat producer 20 includes a chilled water loop 21, a cooling medium loop 23, and a cooling water loop 25. Chilled water flows in the chilled water loop 21 to absorb heat of heat-producing apparatus 20 through a fourth heat exchanger (not shown) and dissipates the heat to cooling medium of the cooling medium loop 23. The cooling medium dissipates heat to cooling water of the cooling water loop 25 through a fifth exchanger (not shown). The cooling water of the cooling water loop 25 flows through a water tower 27 to dissipate heat of the cooling water. In one exemplary embodiment, the cooling medium loop 23 includes a compressor (not shown) to add pressure to the cooling medium.

Figure 6:
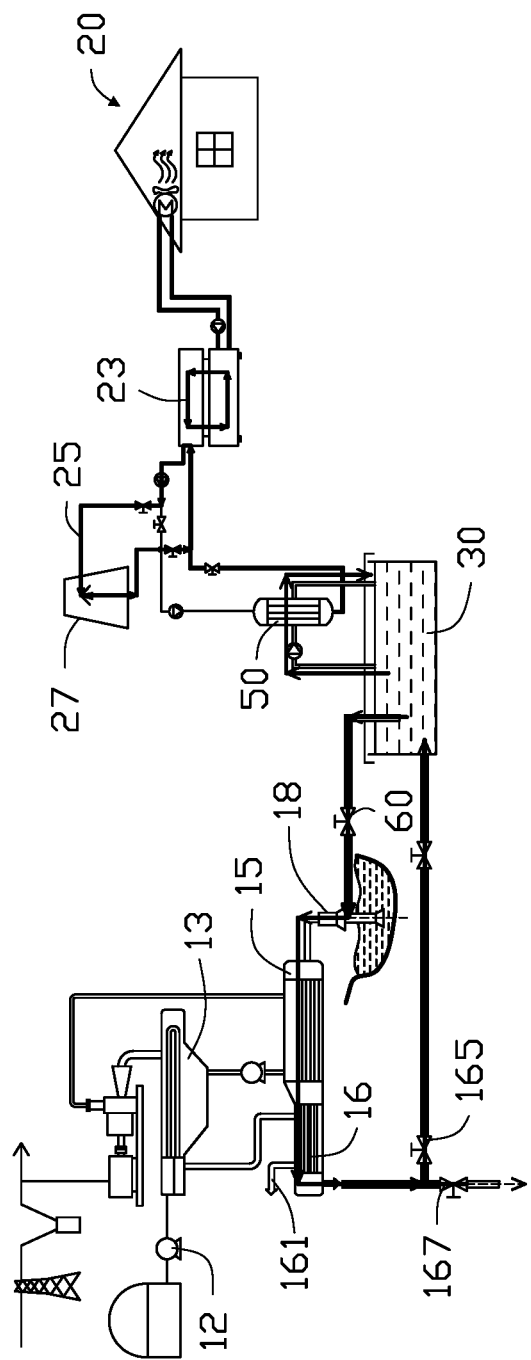
FIG. 6 is diagram of another embodiment of a heat exchange system.

FIG. 6 illustrates that the cooling water loop 25 includes a heat exchanger 50, which is coupled to a water tower 27 and the cooling medium loop 23. Further, the heat exchanger 50 is coupled to the water storage tank 30. Thus, the cooling water of cooling water loop 25 transfers heat to the water of the water storage tank 30 through the heat exchanger 50.

A valve 60 is coupled between the water storage tank 30 and the third pump 18. When the valve 60 is opened, the pump 18 pumps the water from the water storage tank 30 to the heat exchanger 15 and the heat exchanger 16. In another exemplary embodiment, the pump 18 can pump water from the water storage tank 30 and from the pool 40 according to a preset ratio.

In the above exemplary embodiment, heat of the heat dissipation apparatus is transferred to the water of the water storage tank 30 through the chilled water loop 21, the cooling medium loop 23, and the cooling water loop 25 of the heat producer 20.

Heat of the water of the water storage tank 30 is transferred to the LNG through the heat exchanger 13, the heat exchanger 15, and the heat exchanger 16 of the heat exchanger components 10. Therefore, the heat of the heat dissipation apparatus is transferred to the LNG through the heat exchange system.

Figure 7:
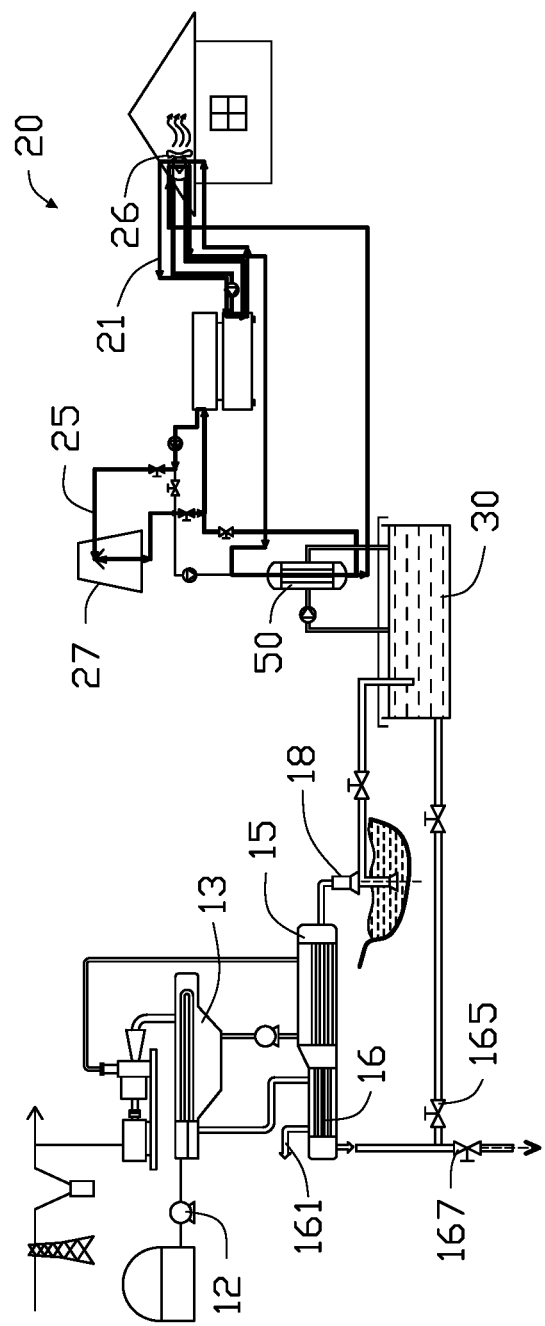
FIG. 7 is diagram of another embodiment of a heat exchange system.

FIG. 7 illustrates another exemplary embodiment of the heat exchange system 100.

In this exemplary embodiment, a pipe is connected between the heat exchanger 50 of the cooling water loop 25 and the chilled water loop 21.

When a temperature of the water in the water storage tank 30 is lower than a lowest temperature of the chilled water in the chilled water loop 21, the chilled water of the chilled water loop 21 flows in the heat exchanger 50 to dissipate heat from the water of the water storage tank 30. Further, the chilled water loop 21 includes a fan 26, which functions as a heat exchanger, for transferring and applying hot air to the chilled water of the water storage tank 30.

In another exemplary embodiment, when the heat-absorbing ability or quantity of the LNG is insufficient, and not all the heat of the heat dissipation apparatus can be absorbed, the chilled water loop 21, the cooling medium loop 23, and the cooling water loop 25 can be utilized to dissipate more heat of the heat-producing apparatus 20.

Figure 8:
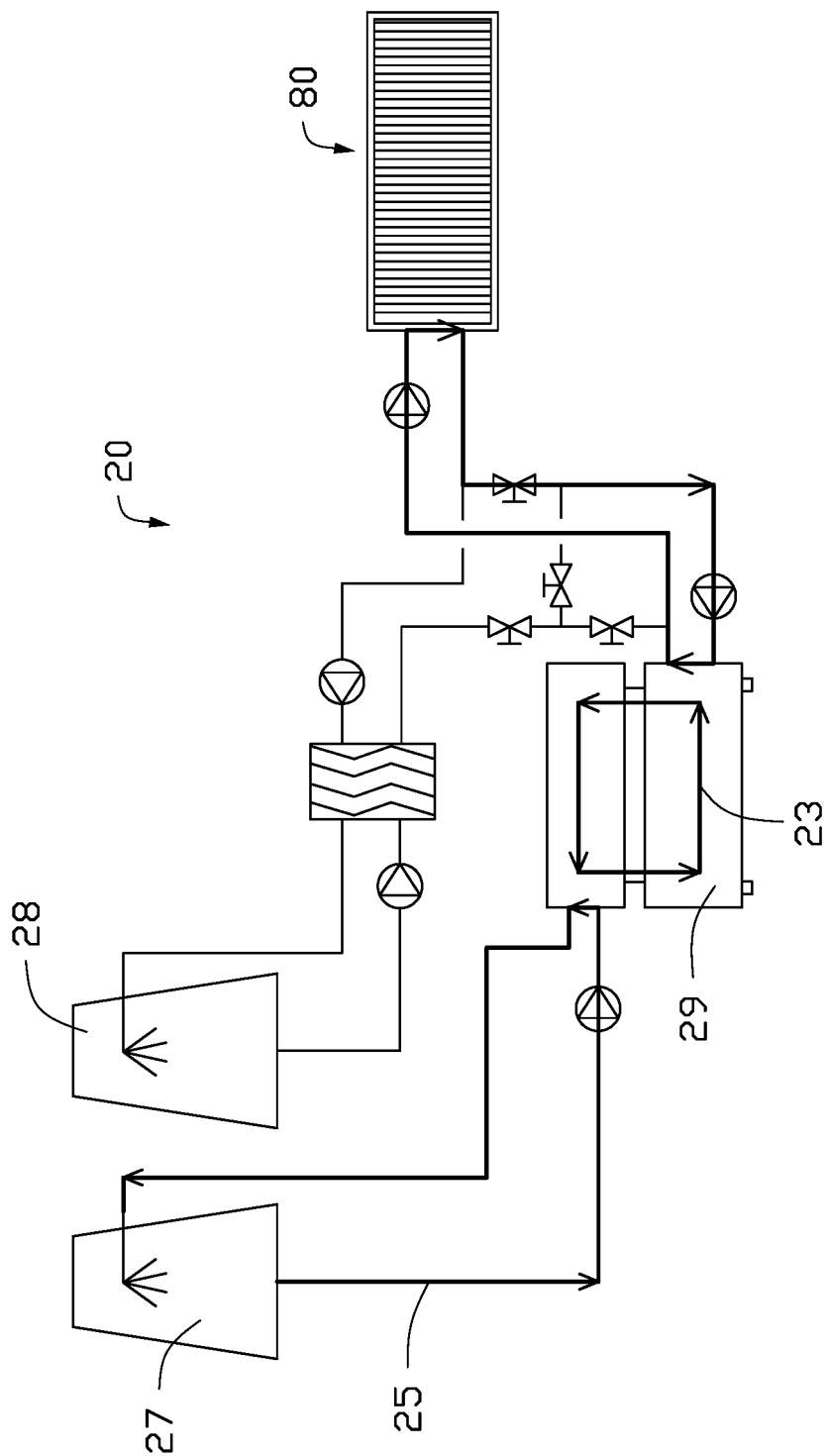
FIGS. 8 and 9 show another exemplary embodiment of a heat exchange system.
Figure 9:
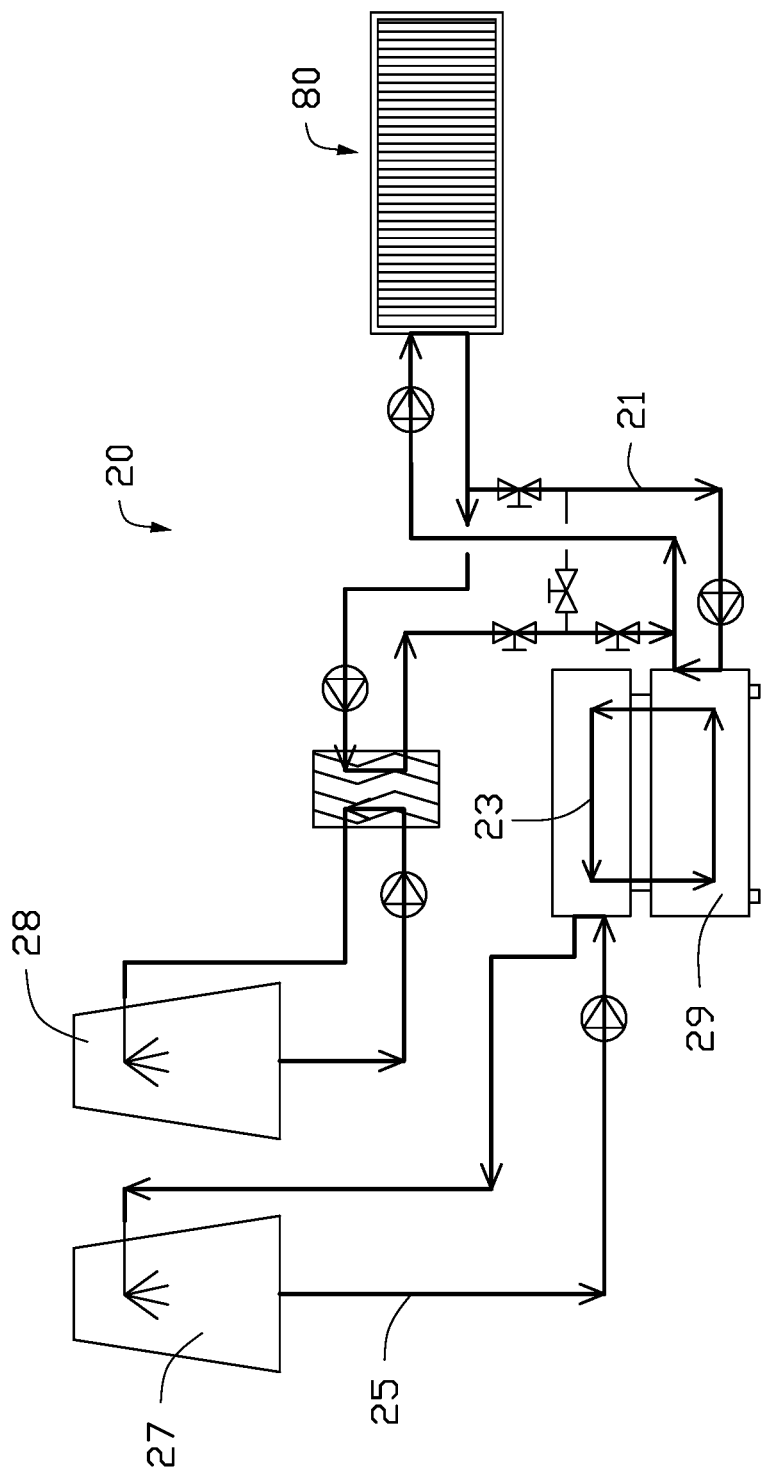

FIGS. 8 and 9 illustrates another exemplary embodiment of heat exchange system.

In this exemplary embodiment, the cooling water loop 25 of the heat producer 20 further includes another water tower 28. When the surrounding temperature is low, the water tower 28 can dissipate heat of the chilled water in the chilled water loop 21.

Therefore, a work load of a compressor 29 of the cooling medium loop 23 is reduced and saves power. When the surrounding temperature is not low and the water tower 28 does not dissipate sufficient heat, the compressor 29 can work at greater power to absorb more heat from the chilled water. Therefore, the heat dissipation apparatus 80 can be cooled.

Figure 10:
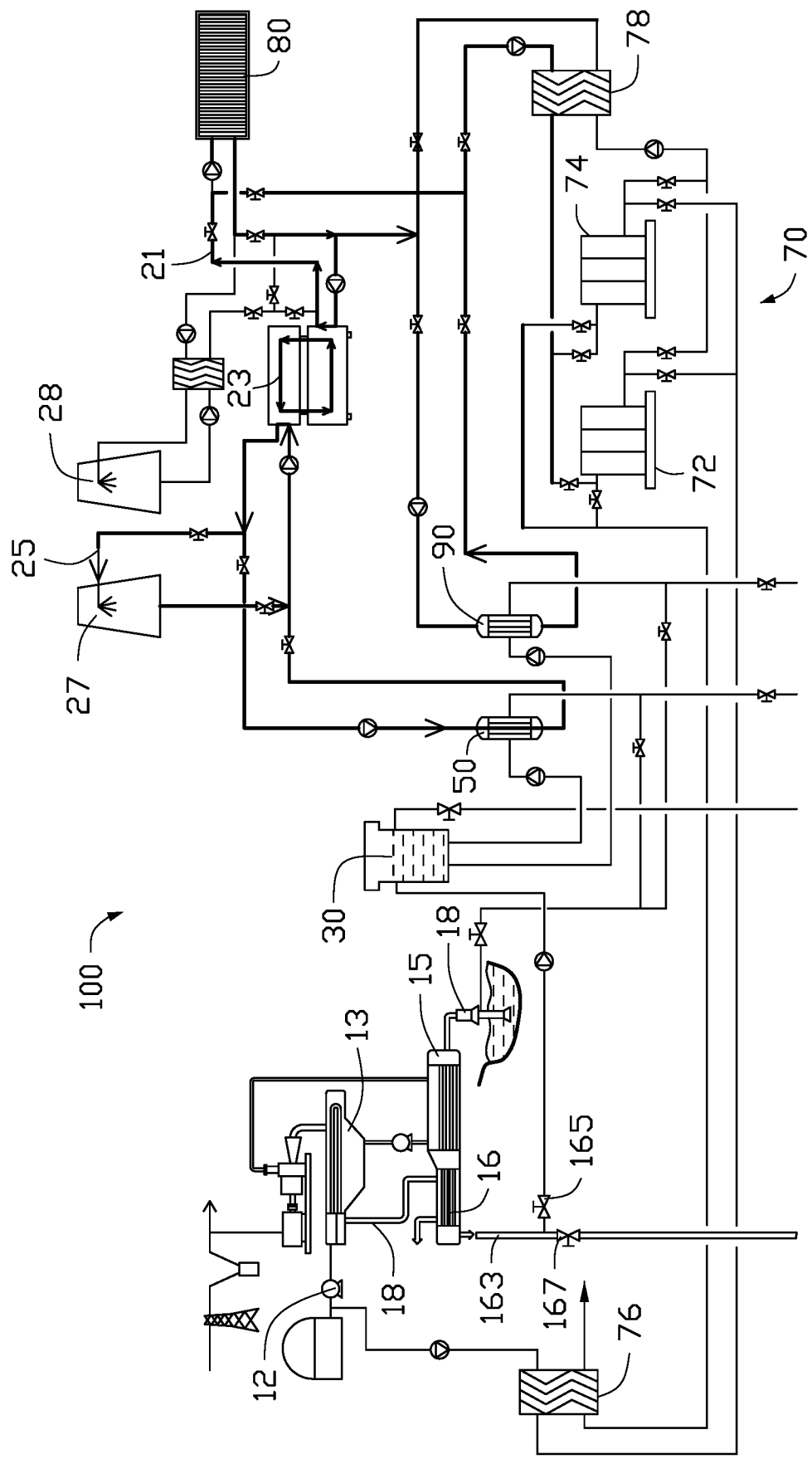
FIG. 10 is diagram of another exemplary embodiment of a heat exchange system.

FIG. 10 illustrates another exemplary embodiment of the heat exchange system. In this exemplary embodiment, the heat exchange system further includes a heat exchanger 90, which is coupled between the chilled water loop 21 and the water storage tank 30.

The heat exchange system further includes a storage tank 70, a heat exchanger 76, and a heat exchanger 78.

In an exemplary embodiment, the heat exchanger 76 and the heat exchanger 78 are each a plate type heat exchanger.

The storage tank 70 includes a first storage tank 72 and a second storage tank 74. The storage tank 70 is coupled between the heat exchanger components 10 and the heat dissipation apparatus 80 through the heat exchanger 76 and the ninth heat exchanger 78. The first storage tank 72 and the second storage tank 74 store the cooling capacity of a cold source discharged from the heat exchanger components 10, and cool heat dissipation apparatus 80.

When a temperature of the water in the water storage tank 30 is lower than the lowest temperature of the chilled water in the chilled water loop 21, the chilled water of the chilled water loop 21 flows in the heat exchanger 90 to directly dissipate heat into the water of the water storage tank 30.

When the temperature of the water in the water storage tank 30 is between the lowest temperature of the chilled water and the highest temperature of the chilled water, the heat exchange 50 and the heat exchanger 90 work simultaneously to dissipate heat of the chilled water.

In another exemplary embodiment, when the LNG can absorb more heat than that being dissipated from the heat dissipation apparatus, water in the water storage tank 30 or other container can be employed to transfer heat. In another aspect, when the heat dissipation apparatus dissipates more heat than the LNG can absorb, or pass on to the water in the water storage tank 30 or other container, can be applied to heat other apparatus.

In another exemplary embodiment, the LNG can be replaced by other substance with similar heat-absorbing properties, such as liquid nitrogen, liquid ammonia, and so on.

The exemplary embodiments shown and described above are only examples. Many details are often found in the art such as the other features of heat exchanger system. Therefore, many such details are neither shown nor described.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A heat exchange system comprising:
   a cold source to be heated;
   a heat dissipation apparatus to be cooled;
   a water storage tank;
   a heat exchanger component coupled between the cold source and the water storage tank;
   a storage tank coupled to the heat exchanger components; and
   a heat producer coupled between the heat dissipation apparatus and the water storage tank;
   wherein the heat producer transfers heat of the heat dissipation apparatus to water in the water storage tank to heat the heat exchanger component, the heat exchanger component transfers heat of the water in the water storage tank to the cold source to heat the cold source, and the storage tank stores the cold source to cool the heat dissipation apparatus; and
   wherein the heat producer comprises a chilled water loop and a cooling water loop, chilled water flows in the chilled water loop to absorb heat of the heat source; and
   wherein the cooling water loop comprises a second heat exchanger, the second heat exchanger is coupled to the water storage tank, the chilled water loop is coupled to a third heat exchanger, wherein when a temperature of the water in the water storage tank is between a lowest temperature of the chilled water and a highest temperature of the chilled water, the second heat exchanger and the third heat exchanger work simultaneously to dissipate heat of the chilled water.

2. The heat exchange system of claim 1, wherein the heat producer further comprises a cooling medium loop, the chilled water flows in the chilled water loop to absorb heat of the heat source and dissipate heat to cooling medium of the cooling medium loop.

3. The heat exchange system of claim 2, wherein the cooling medium dissipates heat to cooling water of the cooling water loop, and the cooling water of the cooling water loop transmits heat to water of the water storage tank.

4. The heat exchange system of claim 1, wherein the cold source is liquefied natural gas (LNG), the LNG is stored in a LNG tank.

5. The heat exchanger system of claim 3, wherein the cooling water loop comprises a water tower to dissipate heat of the cooling water.

6. The heat exchanger system of claim 3, wherein the chilled water of the chilled water loop flows in the third heat exchanger to dissipate heat to the water of the water storage tank when a temperature of the water in the water storage tank is lower than the lowest temperature of the chilled water in the chilled water loop.

7. The heat exchanger system of claim 3, wherein the heat exchanger component comprises a water tower coupled to the chilled water loop, and the water tower dissipates heat of the chilled water in the chilled water loop.

8. The heat exchanger system of claim 3, wherein a fourth heat exchanger is coupled between the chilled water loop and the water storage tank, and the fourth heat exchanger transfers heat of chilled water of the chilled water loop to water of the water storage tank.

9. The heat exchanger system of claim 1, wherein the storage tank comprises a first storage tank and a second storage tank, the first storage tank and the second storage tank stores the cold source to cool the heat dissipation apparatus.

10. A heat exchange system comprising:
    a cold source to be heated;
    a heat dissipation apparatus to be cooled;
    a water storage tank;
    a heat exchanger component coupled between the cold source and the water storage tank;
    a storage tank coupled to the heat exchanger components; and
    a heat producer coupled between the heat dissipation apparatus and the water storage tank;
    wherein the heat producer transfers heat of the heat dissipation apparatus to water in the water storage tank to heat the heat exchanger component, the heat exchanger component transfers heat of the water in the water storage tank to the cold source to heat the cold source, and the storage tank stores the cold source to cool the heat dissipation apparatus;
    wherein the storage tank comprises a first storage tank and a second storage tank, the first storage tank and the second storage tank store the cold source to cool the heat dissipation apparatus; and
    wherein the heat producer comprises a chilled water loop and a cooling water loop, chilled water flows in the chilled water loop to absorb heat of the heat source; and
    wherein the cooling water loop comprises a second heat exchanger, the second heat exchanger is coupled to the water storage tank, the chilled water loop is coupled to a third heat exchanger, wherein when a temperature of the water in the water storage tank is between a lowest temperature of the chilled water and a highest temperature of the chilled water, the second heat exchanger and the third heat exchanger work simultaneously to dissipate heat of the chilled water.

11. The heat exchange system of claim 10, wherein the heat producer further comprises a cooling medium loop, the chilled water flows in the chilled water loop to absorb heat of the heat source and dissipate heat to cooling medium of the cooling medium loop.

12. The heat exchange system of claim 11, wherein the cooling medium dissipates heat to cooling water of the cooling water loop, and the cooling water of the cooling water loop transmits heat to water of the water storage tank.

13. The heat exchange system of claim 10, wherein the cold source is liquefied natural gas (LNG), the LNG is stored in a LNG tank.

14. The heat exchanger system of claim 12, wherein the cooling water loop comprises a water tower to dissipate heat of the cooling water.

15. The heat exchanger system of claim 12, wherein the chilled water of the chilled water loop flows in the third heat exchanger to dissipate heat to the water of the water storage tank when a temperature of the water in the water storage tank is lower than the lowest temperature of the chilled water in the chilled water loop.

16. The heat exchanger system of claim 12, wherein the heat exchanger component comprises a water tower coupled to the chilled water loop, and the water tower dissipates heat of the chilled water in the chilled water loop.

17. The heat exchanger system of claim 12, wherein a fourth heat exchanger is coupled between the chilled water loop and the water storage tank, and the fourth heat exchanger transfers heat of chilled water of the chilled water loop to water of the water storage tank.

* * * * *